United States Patent
Hwang et al.

(10) Patent No.: US 10,109,783 B2
(45) Date of Patent: Oct. 23, 2018

(54) REAR TRAY FOR VEHICLE HAVING ENERGY HARVESTING ELEMENTS

(71) Applicants: Hyundai Motor Company, Seoul (KR); University-Industry Cooperation Group of Kyung Hee University, Yongin-si (KR)

(72) Inventors: Jin Ho Hwang, Seoul (KR); Duk Hyun Choi, Yongin-si (KR); Young Hoon Lee, Ulsan (KR)

(73) Assignees: HYUNDAI MOTOR COMPANY, Seoul (KR); UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 370 days.

(21) Appl. No.: 14/958,713

(22) Filed: Dec. 3, 2015

(65) Prior Publication Data

US 2016/0233828 A1 Aug. 11, 2016

(30) Foreign Application Priority Data

Feb. 5, 2015 (KR) ........................ 10-2015-0018000

(51) Int. Cl.
| | |
|---|---|
| H01L 41/113 | (2006.01) |
| H01L 51/44 | (2006.01) |
| B60R 11/02 | (2006.01) |
| H02N 2/18 | (2006.01) |
| B60R 5/04 | (2006.01) |
| H01L 41/047 | (2006.01) |

(Continued)

(52) U.S. Cl.
CPC ............ *H01L 41/113* (2013.01); *B60R 5/044* (2013.01); *B60R 11/0217* (2013.01); *H01L 51/441* (2013.01); *H02N 2/186* (2013.01); *B60R 2011/0024* (2013.01); *H01L 41/0478* (2013.01); *H01L 41/1138* (2013.01); *H01L 41/193* (2013.01); *Y02E 10/549* (2013.01)

(58) Field of Classification Search
CPC ....................................................... H02N 1/04
USPC .................................................. 310/308, 309
See application file for complete search history.

(56) References Cited

U.S. PATENT DOCUMENTS

| | | | |
|---|---|---|---|
| 6,597,048 B1 * | 7/2003 | Kan ...................... | B81B 3/0008 |
| | | | 257/315 |
| 8,519,596 B1 * | 8/2013 | Kim ........................ | H02N 1/04 |
| | | | 310/309 |
| 2008/0110485 A1 | 5/2008 | Vasilantone | |

(Continued)

FOREIGN PATENT DOCUMENTS

| | | |
|---|---|---|
| JP | 10-125943 A | 5/1998 |
| JP | 2012-110193 A | 6/2012 |

(Continued)

*Primary Examiner* — J. San Martin

(74) *Attorney, Agent, or Firm* — Morgan, Lewis & Bockius LLP

(57) ABSTRACT

A rear tray for a vehicle with structures having energy harvesting elements may include a first energy harvesting element structure installed around a speaker of the rear tray for generating electric energy from friction force, and a second energy harvesting element structure installed at a rear portion of the rear tray for generating electric energy from solar light, driving vibration of the vehicle or both the solar light and the driving vibration of the vehicle.

6 Claims, 6 Drawing Sheets

(51) Int. Cl.
    *H01L 41/193*     (2006.01)
    *B60R 11/00*     (2006.01)

(56) References Cited

U.S. PATENT DOCUMENTS

2013/0049531 A1     2/2013   Wang et al.
2017/0327377 A1*  11/2017  Zhang .................... C01B 32/15

FOREIGN PATENT DOCUMENTS

| KR | 10-2007-0014328 A | 2/2007 |
|----|-------------------|--------|
| KR | 10-2014-0045674 A | 4/2014 |
| KR | 10-1454441 B1 | 11/2014 |

\* cited by examiner

REAR TRAY FOR VEHICLE HAVING ENERGY HARVESTING ELEMENTS

CROSS-REFERENCE TO RELATED APPLICATION

The present application claims priority of Korean Patent Application Number 10-2015-0018000 filed on Feb. 5, 2015, the entire contents of which application are incorporated herein for all purposes by this reference.

BACKGROUND

Technical Field

The present invention relates to a rear tray for a vehicle with a structure having energy harvesting elements, and more particularly, to a rear tray for a vehicle with a structure having various energy harvesting elements to generate electric energy for an auxiliary power source of an eco-friendly vehicle.

Background Art

In an eco-friendly vehicle such as a hybrid vehicle, an electric vehicle, and a fuel-cell vehicle, a high-voltage battery is mounted as a driving power source of a motor which is a driving power source. In addition, an auxiliary battery for supplying power to various electrical equipments and a controller is mounted.

In the case of the high-voltage battery and the auxiliary battery which are used in the eco-friendly vehicle, an optimal charging amount is always managed to be stored. To this end, various types of battery charging control strategies such as regenerative braking control have been used.

Further, energy harvesting elements which charge a battery of the eco-friendly vehicle and generate separate electric energy so as to be used as the power for various electrical equipments have been applied to the vehicle.

As an example in which the energy harvesting elements are mounted on the vehicle, in Korean Patent Unexamined Publication No. 2007-0014328, it is disclosed that a piezoelectric element assembly for generating the electric energy is mounted on an axel of the vehicle.

Further, as another example in which the energy harvesting elements are mounted on the vehicle, in US Patent Unexamined Publication No. 2008-0110485, a structure in which a collector plate which stores solar energy in a roof panel of the vehicle is mounted is disclosed.

As such, various researches have been conducted so as to obtain electric energy by mounting the energy harvesting elements on the vehicle, and further, methods for increasing harvesting efficiency of the energy harvesting elements mounted on the vehicle have been researched.

The information disclosed in this Background section is only for enhancement of understanding of the general background of the invention and should not be taken as an acknowledgement or any form of suggestion that this information forms the prior art already known to a person skilled in the art.

SUMMARY OF THE DISCLOSURE

The present invention has been made in an effort to solve the above-described problems associated with prior art and/or other problems, and to provide a rear tray for a vehicle with a structure having energy harvesting elements with an improved structure which may easily mount the energy harvesting element which converts the vibration and friction energy into the electric energy and the energy harvesting element which converts the solar light energy into the electric energy when a rear tray structure of the vehicle which may obtain vibration energy of a vehicle body while solar light energy flows/transmits best.

In one aspect, the present invention provides a rear tray for a vehicle with a structure having energy harvesting elements in which a first energy harvesting element structure is installed around a speaker of the rear tray for generating electric energy from friction force, and a second energy harvesting element structure is installed at a rear portion of the rear tray for generating electric energy from solar light, driving vibration of the vehicle or both the solar light and the driving vibration of the vehicle.

In a preferred embodiment, the first energy harvesting element structure includes: a support frame fixedly installed to a vehicle body around the speaker at a bottom of the rear tray; a first tribo element installed at a speaker edge of the rear tray and vibrating when the speaker operates; a second tribo element disposed to friction-contact an outer diameter of the first tribo element while contacting the support frame and the bottom of the rear tray to transfer vibration; and a spring connected between the second tribo element and the support frame.

In another preferred embodiment, the second energy harvesting element structure includes: a mounting hole formed at a rear portion of the rear tray in a width direction of the vehicle; a textile solar cell or a piezoelectric energy harvesting element inserted into the mounting hole to generate electric energy from the solar light or the driving vibration of the vehicle; and a support plate coupled with a bottom of the rear tray while supporting a lower portion of the textile solar cell or the piezoelectric energy harvesting element.

In still another preferred embodiment, the textile solar cell and the piezoelectric energy harvesting element are alternately arranged and installed in the mounting hole in a hybrid form.

In yet another preferred embodiment, the textile solar cell is installed at a rear curtain which is installed on the rear tray and able to ascend and descend to cover a rear glass.

In still yet another preferred embodiment, a controller and a battery for storing the electric energy are connected to the first energy harvesting element structure and the second energy harvesting element structure.

According to various aspects, the present invention provides the following effects.

The rear tray structure of the vehicle is improved to a structure which may mount or include the energy harvesting element which converts the vibration and friction energy into the electric energy and the energy harvesting element which converts the solar light energy into the electric energy to generate electric energy by each energy harvesting element and use the harvested electric energy as the auxiliary power of the vehicle.

Other aspects and preferred embodiments of the invention are discussed infra.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

The above and other features of the present invention will now be described in detail with reference to certain embodiments thereof illustrated the accompanying drawings which are given hereinbelow by way of illustration only, and thus are not limitative of the present invention, and wherein.

Figure 1:
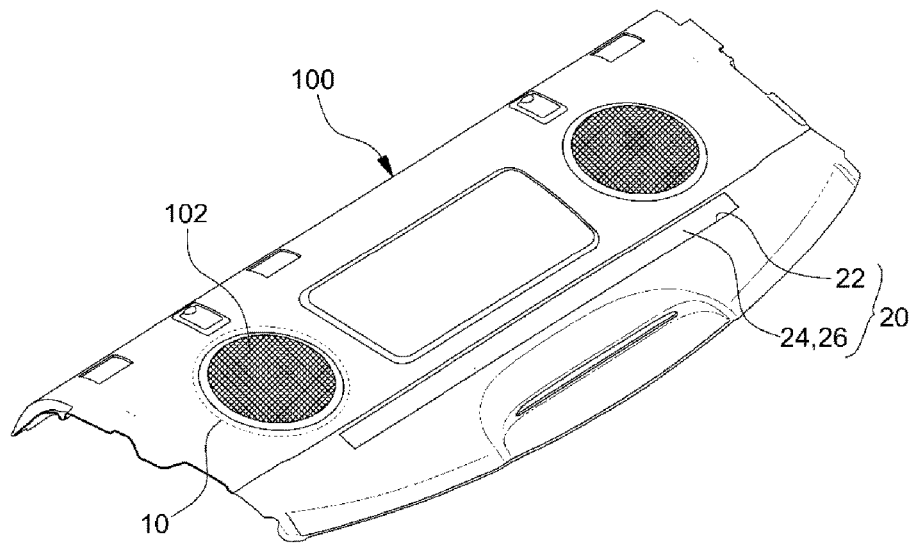
FIG. 1 is a perspective view illustrating an exemplary rear tray for a vehicle with a structure having energy harvesting elements according to the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Generally, a rear tray for a vehicle as a kind of interior material for the vehicle is mounted on a space between a rear sheet and a rear glass. A woofer type of speaker is installed and a space into which solar light flows/transmits best is configured.

The present invention provides a rear tray for a vehicle that includes structures with energy harvesting elements (e.g., tribo element, textile solar cell, piezoelectric energy harvesting element, etc.) to convert various types of energy (e.g., friction, vibration and solar energy) into electric energy. The present invention improves a rear tray structure of the vehicle to enhance the harvesting of vibration, friction and solar energy.

Figure 2:
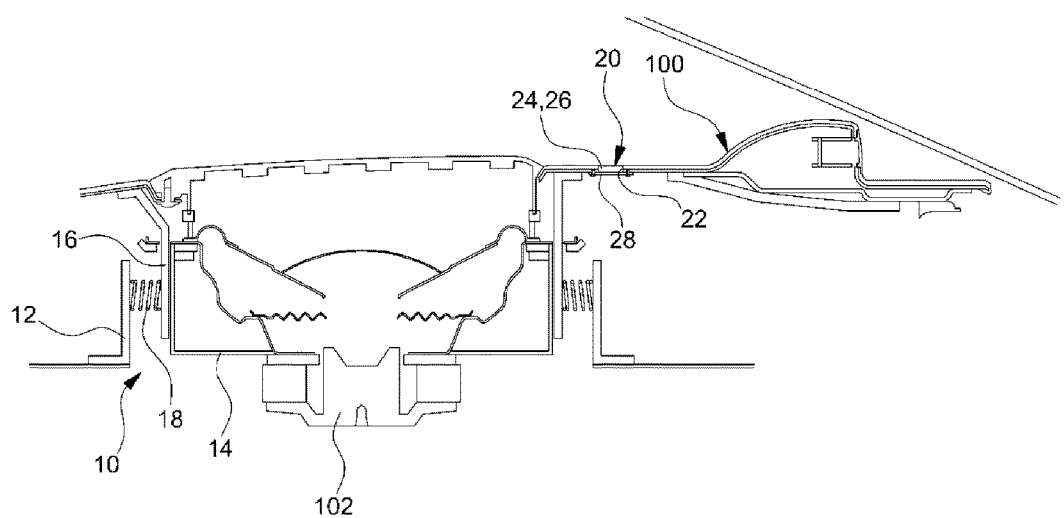
FIG. 2 is a cross-sectional view illustrating an exemplary rear tray for the vehicle with the structure having the energy harvesting elements according to the present invention.

FIG. 1 is a perspective view illustrating an appearance of a rear tray for a vehicle with a structure having energy harvesting elements according to some embodiments of the present invention, and FIG. 2 is a cross-sectional view illustrating the rear tray for the vehicle with the structure having the energy harvesting elements according to some embodiments of the present invention. In FIGS. 1 and 2, reference numeral 100 indicates a rear tray for the vehicle.

In the rear tray 100, a woofer type of speaker 102 is installed, vibration is emitted to the rear tray and around the rear tray when the speaker operates, and further, the rear tray 100 vibrates according to driving vibration of the vehicle.

According to the present invention, a structure 10 having a first energy harvesting element which generates electric energy by vibration friction when the speaker operates is installed around the speaker 102 of the rear tray 100. Further, a structure 20 having a second energy harvesting element which harvests energy from solar light or driving vibration of the vehicle is installed at a rear portion of the rear tray 100 behind the speaker 102.

The structure 10 having the first energy harvesting element is provided as a structure for mounting a tribo element which generates the electric energy by using voltage generated by friction of two conductors.

Figure 7:
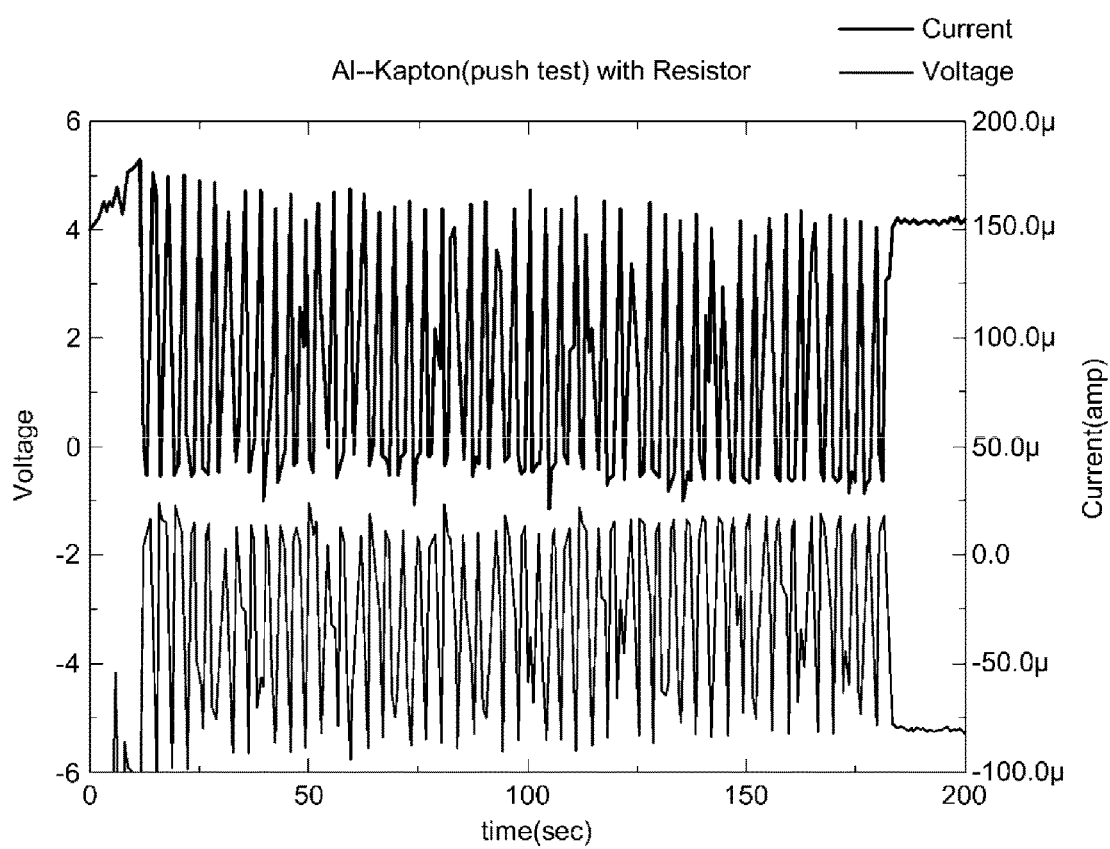
FIG. 7 is a voltage-current graph according to a tribo element included in an exemplary structure having the energy harvesting elements according to the present invention.

The tribo element is an element which generates electricity by relative frictional force between two conductors like a generator and known to generate electric energy of which voltage is very high and current is very small electric energy like lightning, and may obtain voltage and current data with time as illustrated in FIG. 7 when the tribo element is applied.

As a result, a first tribo element 14 is installed at a rear edge portion of the speaker 102 positioned at the bottom of the rear tray 100 to be vibrated when the speaker 102 operates. Further, a second tribo element 16 is disposed to relatively frictionally contact an outer surface of the first tribo element 14.

In more detail, an upper surface of the second tribo element 16 contacts the bottom of the rear tray 100 so as to transfer driving vibration and an inner surface thereof is disposed to relatively frictionally contact the outer surface of the first tribo element 14.

In some embodiments, a support frame 12 having a rectangular frame type for an attachment of the second tribo element 16 is installed on the vehicle body 104 around the speaker 102.

Further, a spring 18 which vibration of the second tribo element 16 is displaceable is connected between the inner surface of the support frame 12 and the outer surface of the second tribo element 16, and thus the vibration is transferred to the second tribo element 16 through the support frame 12 and the spring 18 when the vehicle is driven.

Accordingly, while the first tribo element 14 installed above is displaced by the vibration when the speaker 102 operates, the first tribo element 14 generates electric energy by relative friction with the second tribo element 16.

Further, the second tribo element 16 is displaced by the driving vibration of the vehicle, that is, the vibration transferred through the support frame 12 and the spring 18 when the vehicle is driven and the vibration transferred through the rear tray 100, the second tribo element 16 generates electric energy by relative friction with the first tribo element 14.

The electric energy generated by the first and second tribo elements is charged and stored in a battery which is an energy storage device through a controller to be used as an auxiliary power source for various electrical equipments (for example, a conditioning blower and the like).

Meanwhile, the structure 20 having the second energy harvesting element which harvests the energy by solar light and driving vibration of the vehicle is installed at the rear portion of the rear tray 100 behind the speaker 102.

The structure 20 having the second energy harvesting element is provided as a structure for mounting a textile solar cell 24 which generates electric energy from solar light transmitted through the rear glass and/or a piezoelectric energy harvesting element 26 which generates electric energy from driving vibration of the vehicle.

Figure 3:
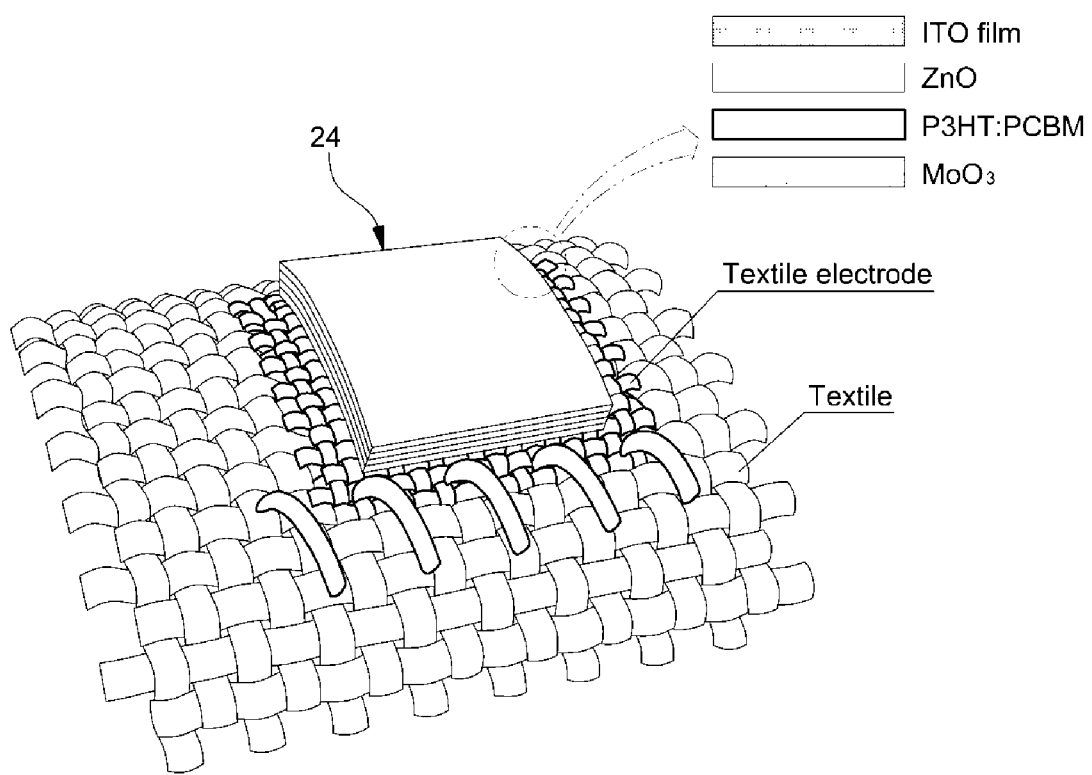
FIG. 3 is a structural view illustrating a textile solar cell included in an exemplary structure having the energy harvesting elements according to the present invention.

The textile solar cell 24 is configured by sequentially laminating an ITO film, zinc oxide (ZnO) which is an n type inorganic piezoelectric semiconductor material, poly(3-hexythiophene (P3HT): phenly-$C_{61}$-butyric acid methyl ester (PCBM) which is a P type organic piezoelectric semiconductor material, and molybdenum oxide (MoOx) from an upper layer to have a structure attached on a textile electrode coated on the textile, as illustrated in FIG. 3.

In this case, the phenly-$C_{61}$-butyric acid methyl ester (PCBM) as a conductive polymer serves to improve piezoelectric efficiency by inducing a change of Fermi Level on organic and inorganic interfaces due to a piezoelectric potential.

In order to install the textile solar cell 24 provided above, in some embodiments, a mounting hole 22 is formed in a width direction of the vehicle at the rear portion of the rear tray 100. Then, the textile solar cell 24 is inserted and fixed into the mounting hole 22, and thereafter, a support plate 28 supporting the lower portion of the textile solar cell 24 is coupled with the bottom of the rear tray 10, and as a result, the textile solar cell 24 for the rear tray 100 is installed.

Preferably, in some embodiments, the textile solar cell 24 may be further attached to a rear curtain which is installed on the rear tray to ascend and descend in order to cover the solar light which is transmitted through the mounting hole 22 of the rear tray 100 and the rear glass.

Figure 4:
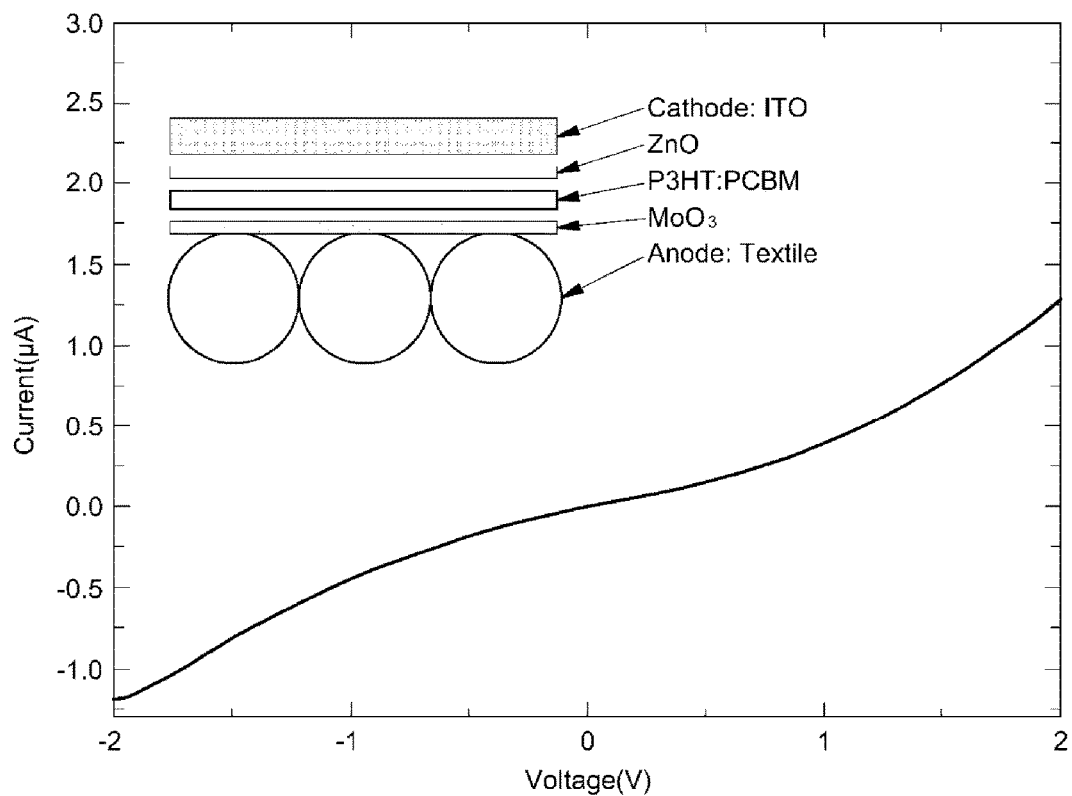
FIG. 4 is a voltage-current graph according to the textile solar cell illustrated in FIG. 3.

In the case of the textile solar cell installed above, it is advantageous that a voltage-current relationship in a grape illustrated in FIG. 4 may be obtained, power of 1.0 to 1.2 V per unit cm can be generated, and maintenance cost except for initial cost is decreased due to a semi-permanent lifespan.

Similarly, the electric energy generated by the textile solar cell is charged and stored in a battery which is an energy storage device through a controller to be used as an auxiliary power source for various electrical equipments (for example, a conditioning blower and the like).

Meanwhile, the piezoelectric energy harvesting element 26 instead of the textile solar cell may be mounted in the mounting hole 22 formed in the rear tray 100.

Figure 5:
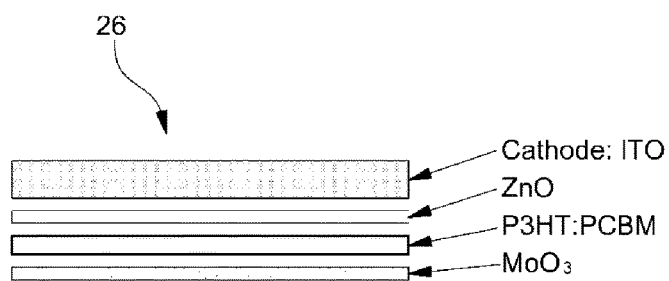
FIG. 5 is a structural view illustrating piezoelectric energy harvesting elements included in an exemplary structure having the energy harvesting elements according to the present invention.

The piezoelectric energy harvesting element 26 is an element which converts mechanical energy existing in an ambient environment such as ultrasound, micro-vibration, blood flow, wind, tide, and body movement into electric energy by using a piezoelectric effect, and as illustrated in FIG. 5, is provided by sequentially laminating an ITO film, zinc oxide (ZnO) which is an n type inorganic piezoelectric semiconductor material, poly(3-hexythiophene (P3HT): phenly-$C_{61}$-butyric acid methyl ester (PCBM) which is a P type organic piezoelectric semiconductor material, and molybdenum oxide (MoOx) from an upper layer.

Then, a hybrid element in which an n type inorganic material and a p type organic material are combined, that is, the piezoelectric energy harvesting element 26 is inserted and fixed into the mounting hole 22, and thereafter, a support plate 28 supporting the lower portion of the piezoelectric energy harvesting element 26 is coupled with the bottom of the rear tray 100, and as a result, the piezoelectric energy harvesting element 26 for the rear tray 100 is installed.

In the case of the piezoelectric energy harvesting element installed above, when pressure is applied to a crystal in which atoms are regularly arranged in a predetermined direction, a voltage-current relationship such as a graph illustrated in FIGS. 6A-6D may be obtained by a principle in which electricity is generated when pressure or vibration is applied by mutually converting mechanical energy and electric energy through a dielectric characteristic in which an electric polarization phenomenon is induced, that is, a piezoelectric body.

Figure 6A:
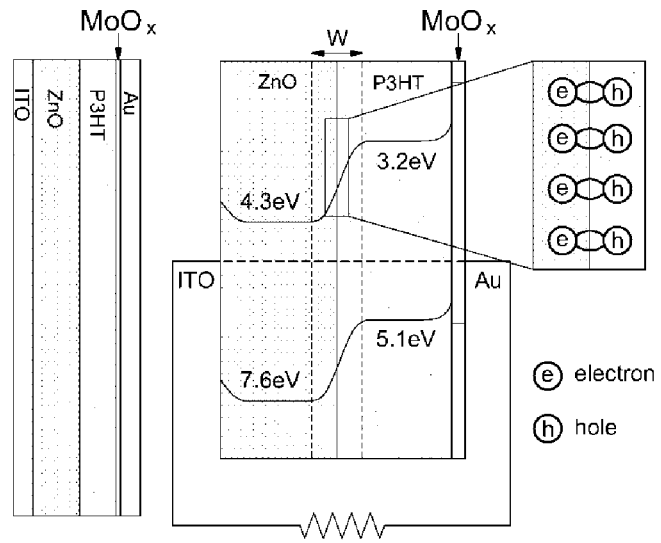
FIG. 6A, FIG. 6B, FIG. 6C and FIG. 6D are diagrams illustrating a harvesting principle of the piezoelectric energy harvesting elements illustrated in FIG. 5.
Figure 6B:
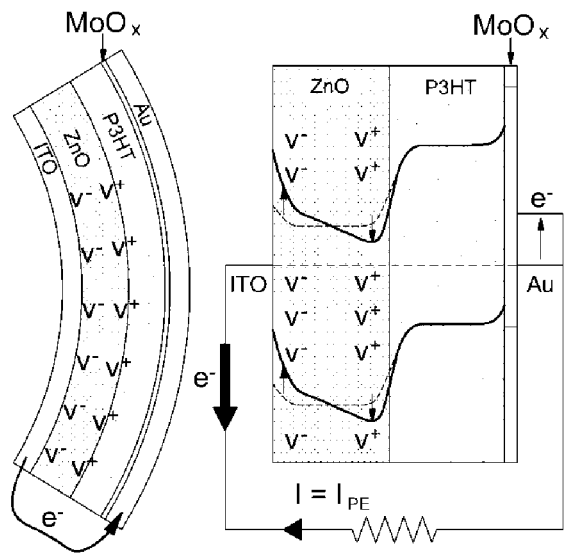
Figure 6C:
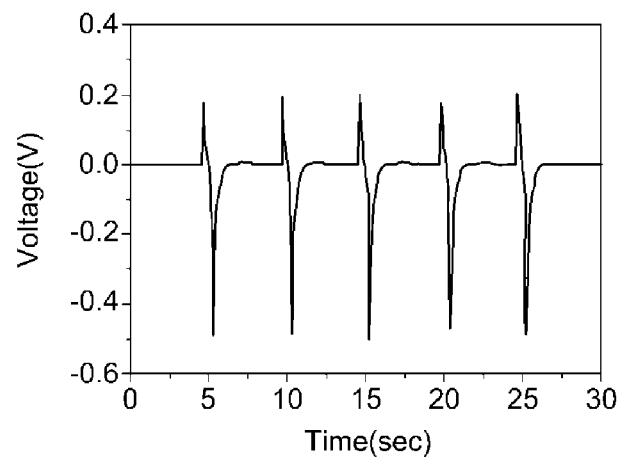
Figure 6D:
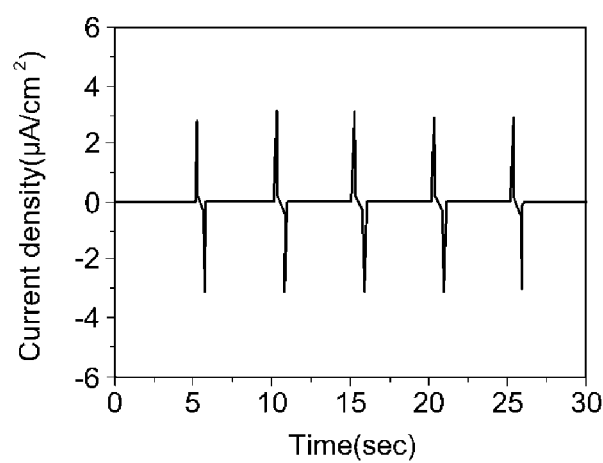

That is, when describing a battery energy harvesting mechanism of the piezoelectric energy harvesting element having organic/inorganic hybrid structure based on zinc oxide which is an n-type inorganic piezoelectric semiconductor and p-type P3HT, a mechanical displacement occurs from a state of FIG. 6A to a state of FIG. 6B by driving vibration of the vehicle, and thus voltage illustrated in FIG. 6C is generated, and as a result, current density illustrated in FIG. 6D may be obtained.

Similarly, the electric energy generated by the piezoelectric energy harvesting element is also charged and stored in a battery which is an energy storage device through the controller to be used as an auxiliary power source for various electrical equipments (for example, a conditioning blower and the like).

Meanwhile, in some embodiments, the textile solar cell 24 and the piezoelectric energy harvesting element 26 may be alternately arranged and installed in the mounting hole 22 of the rear tray 100 in a hybrid form.

As described above, the rear tray structure of the vehicle is improved to include a structure having energy harvesting element(s) to convert the vibration and friction energy into the electric energy and energy harvesting element(s) which converts the solar light energy into the electric energy to generate electric energy by each energy harvesting element and use the harvested electric energy as the auxiliary power of the vehicle.

For convenience in explanation and accurate definition in the appended claims, the terms "upper" or "lower", "front" or "rear", and etc. are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A rear tray for a vehicle with structures having energy harvesting elements, the rear tray comprising:
 a first energy harvesting element structure installed around a speaker of the rear tray for generating electric energy from friction force; and
 a second energy harvesting element structure installed at a rear portion of the rear tray for generating electric energy from solar light, driving vibration of the vehicle or both the solar light and the driving vibration of the vehicle.

2. The rear tray of claim 1, wherein the first energy harvesting element structure includes:
 a support frame fixedly installed to a vehicle body around the speaker at a bottom of the rear tray;
 a first tribo element installed at a speaker edge of the rear tray and vibrating when the speaker operates;
 a second tribo element disposed to friction-contact an outer diameter of the first tribo element while contacting the support frame and the bottom of the rear tray to transfer vibration; and
 a spring connected between the second tribo element and the support frame.

3. The rear tray of claim 1, wherein the second energy harvesting element structure includes:
 a mounting hole formed at a rear portion of the rear tray in a width direction of the vehicle;
 a textile solar cell or a piezoelectric energy harvesting element inserted into the mounting hole to generate electric energy from the solar light or the driving vibration of the vehicle; and
 a support plate coupled with a bottom of the rear tray while supporting a lower portion of the textile solar cell or the piezoelectric energy harvesting element.

4. The rear tray of claim 3, wherein the textile solar cell is installed at a rear curtain which is installed on the rear tray and able to ascend and descend to cover a rear glass.

5. The rear tray of claim 1, wherein a controller and a battery for storing the electric energy are connected to the first energy harvesting element structure and the second energy harvesting element structure.

6. The rear tray of claim 1,
 wherein the second energy harvesting element structure includes:
  a mounting hole formed at a rear portion of the rear tray in a width direction of the vehicle;
  a textile solar cell and a piezoelectric energy harvesting element inserted into the mounting hole to generate electric energy from the solar light and the driving vibration of the vehicle; and
  a support plate coupled with a bottom of the rear tray while supporting lower portions of the textile solar cell and the piezoelectric energy harvesting element, and
 wherein the textile solar cell and the piezoelectric energy harvesting element are alternately arranged and installed in the mounting hole in a hybrid form.

* * * * *